United States Patent [19]

Matsubara et al.

[11] Patent Number: 5,065,505

[45] Date of Patent: Nov. 19, 1991

[54] METHOD FOR CONNECTING CIRCUIT BOARDS

[75] Inventors: Hiroshi Matsubara; Takashi Nukii, both of Nara, Japan

[73] Assignee: Sharp Kabushiki Kaisha, Osaka, Japan

[21] Appl. No.: 595,086

[22] Filed: Oct. 10, 1990

[30] Foreign Application Priority Data

Oct. 17, 1989 [JP] Japan .................................. 1-271072

[51] Int. Cl.⁵ ............................................... H05K 3/36
[52] U.S. Cl. ..................... 29/830; 156/275.5; 252/512
[58] Field of Search .................. 29/25.35, 830, 861, 29/854; 156/275.5, 275.7

[56] References Cited

U.S. PATENT DOCUMENTS

| | | | |
|---|---|---|---|
| 4,157,407 | 6/1979 | Peiffer | 156/275.5 X |
| 4,744,850 | 5/1988 | Imano et al. | 156/275.5 X |
| 4,780,371 | 10/1988 | Joseph et al. | 252/512 X |
| 4,859,268 | 8/1989 | Joseph et al. | 156/275.5 |

FOREIGN PATENT DOCUMENTS

| | | | |
|---|---|---|---|
| 57-165476 | 10/1982 | Japan | 156/275.5 |
| 60-133681 | 7/1985 | Japan | 156/275.5 |
| 1-214498 | 8/1989 | Japan | 156/275.5 |

OTHER PUBLICATIONS

Japanese Published Unexamined Patent Application (No. HEI1 (1989)-227,444, and English abstract thereof.

Primary Examiner—Carl J. Arbes
Attorney, Agent, or Firm—David G. Conlin; Robert M. Asher

[57] ABSTRACT

A method for connecting circuit boards in which a first circuit board having first electrodes is superposed on a second circuit board of which second electrodes are formed in positions corresponding to the first electrodes so that the first and second electrodes are electrically connected with each other, the method comprising a first step of applying a photocuring adhesive on the first electrodes and the residual regions of the first circuit board on which the first electrodes are not formed, a second step of irradiating light from a surface opposite to the surface of the first circuit board on which the first electrodes are formed to cure the photocuring adhesive on the residual regions of the first circuit board on which the first electrodes are not formed, a third step of adhering particles which are conductive at least on outer peripheral surfaces to the first electrodes by means of the uncured photocuring adhesive, and a fourth step of superposing the first circuit board to which the particles are adhered on the second circuit board to electrically connect the first and second electrodes with each other through the particles, provided that the first electrodes are opaque and the first circuit board is light-transmissive.

10 Claims, 2 Drawing Sheets

METHOD FOR CONNECTING CIRCUIT BOARDS

BACKGROUND OF THE INVENTION

1. Field of the Invention

The present invention relates to a method for electrically connecting a light-transmissive circuit board such as a flexible board or a glass board with a circuit board such as a semiconductor substrate, a printed board, a glass board, a flexible board or a ceramic board.

2. Description of the Prior Art

Conventionally, the circuit boards have been mainly connected with each other by soldering. In this case, a soldered layer is formed on an electrode of at least one of the circuit boards by plating, printing or the like, and the soldered layer thus formed is heated to a temperature of about 200° to 250° C. and melted so that it is connected with the electrode of the other circuit board. Accordingly, the soldering method requires a parent soldering metal such as Au, Cu, Ni or the like as an electrode material. In the case in which a circuit board such as a liquid crystal display board is connected, it is hard for an ITO (indium tin oxide) film used in the liquid crystal display board to melt and directly join with a soldering metal. Therefore, it is required to separately form a parent soldering metallic layer on the ITO film. Consequently, the cost is increased. Furthermore, since solder is heated and melted to connect both electrodes with each other, a short-circuit may easily be occurred between terminals adjacent to each other if a pitch of the electrode to be connected is fine.

In recent years, there has been used a method for connecting circuit boards by means of an anisotropic conductive adhesive in order to avoid thermal damage to the circuit boards by high temperature treatment such as soldering and an increase in cost caused by using the parent soldering metal. The anisotropic conductive adhesive has conductive particles dispersed therein. If pressure is applied, the conductive particles are condensed and fixed. Consequently, the anisotropic conductive adhesive becomes conductive only in a direction of a thickness thereof, while it becomes non-conductive in other directions. An anisotropic conductive adhesive layer is formed on the surface of the electrode or terminal to be connected and then pressurized therebetween in the direction of a thickness thereof so that the electrodes or terminals are electrically connected with each other by means of the conductive particles. Furthermore, the electrodes or terminals are mechanically connected with each other by means of the adhesive.

In particular, the anisotropic conductive adhesive has often been used in connecting terminals of the liquid crystal display board in view of easiness of connection and thermal conditions.

In a method using the anisotropic conductive adhesive mentioned above, if the electrode or terminal to be connected has a pitch width of at least 150 μm, it can be connected well with the electrode or terminal opposite thereto. If the electrode or terminal has the pitch width less than 150 μm, it becomes conductive between the electrodes or terminals adjacent to each other because the conductive particles are dispersed in the adhesive. Consequently, the short-circuit is caused.

SUMMARY OF THE INVENTION

It is an object of the present invention to provide a method for connecting circuit boards in which the above problem can be solved to correspond to the fineness of the electrodes or terminals and improve the reliability of connection.

It is another object of the present invention to provide a method for connecting circuit boards in which a first circuit board having first electrodes is superposed on a second circuit board of which second electrodes are formed in positions corresponding to the first electrodes so that the first and second electrodes are electrically connected with each other, the method comprising:

a first step of applying a photocuring adhesive on the first electrodes and the residual regions of the first circuit board on which the first electrodes are not formed;

a second step of irradiating light from a surface opposite to the surface of the first circuit board on which the first electrodes are formed to cure the photocuring adhesive on the residual regions of the first circuit board on which the first electrodes are not formed;

a third step of adhering particles which are conductive at least on outer peripheral surfaces to the first electrodes by means of the uncured photocuring adhesive; and a fourth step of superposing the first circuit board to which the particles are adhered on the second circuit board to electrically connect the first and second electrodes with each other through the particles, provided that the first electrodes are opaque and the first circuit board is light-transmissive.

According to the method for connecting circuit boards of the present invention, the photocuring adhesive is applied on the first light-transmissive circuit board on which the first shaded electrodes are formed and the light is irradiated from the surface opposite to the surface on which the first electrodes are formed. Even if the light is irradiated, the photocuring adhesive on the first electrodes is shaded by the first electrodes themselves so that it keeps uncured and adhesive. On the other hand, the photocuring adhesive applied on the residual regions of the first circuit board is cured to become non-adhesive by light irradiation. Consequently, only the photocuring adhesive on the first electrodes is selectively uncured and adhesive so that the conductive particles can be adhered thereto. In other words, the conductive particles can selectively be arranged on the electrodes.

DETAILED DESCRIPTION OF A PREFERRED EMBODIMENT

Figure 1:
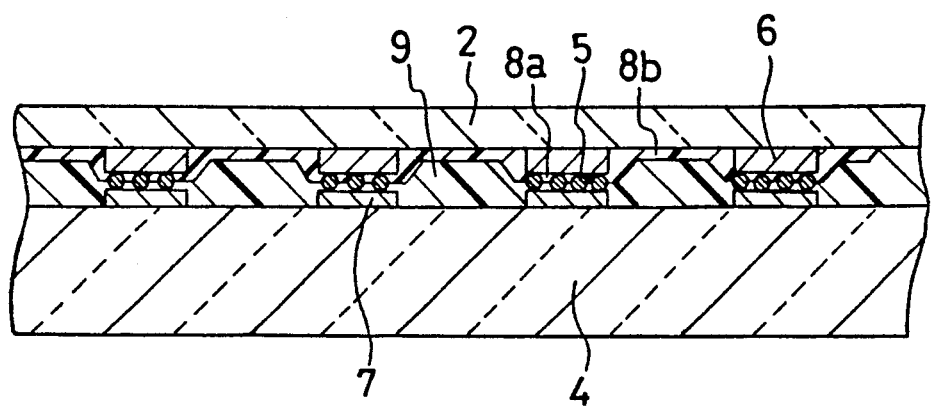
FIG. 1 is a section view showing a construction of circuit boards of which electrodes are connected with each other in accordance with the present invention.
Figure 2:
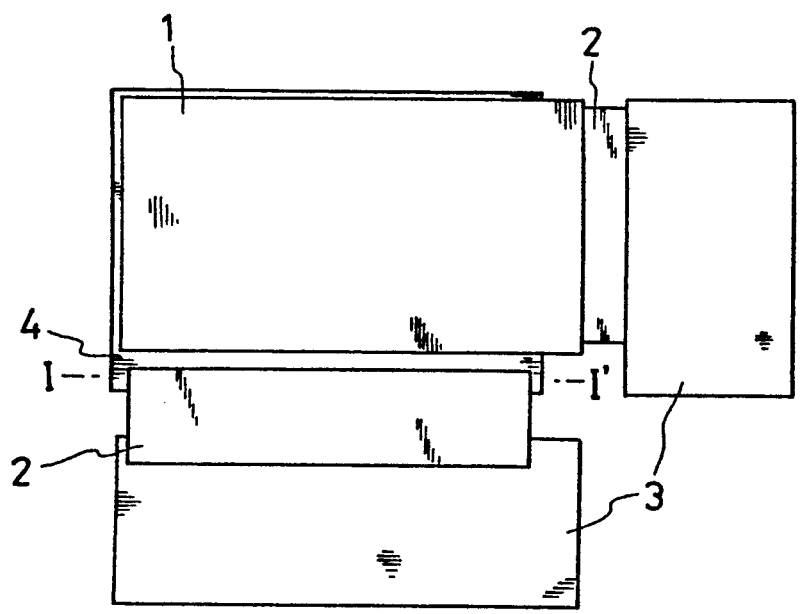
FIG. 2 is a plan view of a liquid crystal display device in which a glass board of a liquid crystal display element is connected with the circuit boards through light-transmissive flexible boards.

FIG. 1 is a partial section view taken along the line I—I' in FIG. 2 to be described below and shows a construction of circuit boards of which electrodes are connected with each other in accordance with the present invention. FIG. 2 is a plan view of a liquid crystal display device in which a glass board 4 of a liquid crystal display element is connected with circuit boards 3 for driving liquid crystals through flexible boards 2.

Referring to FIGS. 1 and 2, the glass board 4 of the liquid crystal display element is connected with the circuit boards 3 through the light-transmissive flexible boards 2 in accordance with the present invention. The circuit board 3 is formed by providing an element such as a large scale integration (referred to as an LSI) on a printed board and drives the liquid crystals. The light-transmissive flexible board 2 which is a first circuit board has first shaded electrodes 6 formed on one surface thereof. The first shaded electrodes 6 are connected with second electrodes 7 of the glass board 4 which is a second circuit board. Similarly, the second electrode 7 is formed in a position corresponding to the first electrode 6 on the glass board 4 and also has the size corresponding thereto. In addition, conductive particles 5 are selectively adhered to the first electrode 6 by means of a photocuring adhesive 8a. The second electrodes 7 on the glass board 4 of the liquid crystal display element are electrically connected with the first electrodes 6 of the flexible board 2 through the conductive particles 5. The conductive particles 5 are selectively arranged on the first electrodes 6 of the flexible board 2 in accordance with the present invention as described below with reference to FIG. 3.

The second electrode 7 may be an electric conductor such as ITO (indium tin oxide), Ti, Ta, Mo, Ni, Al or the like, or their alloy and has one layer or more. The first electrode 6 is an electric conductor such as Cu, Ni, Au, Sn, Pb, Al or the like, or their alloy and has one layer or more.

Figure 3:
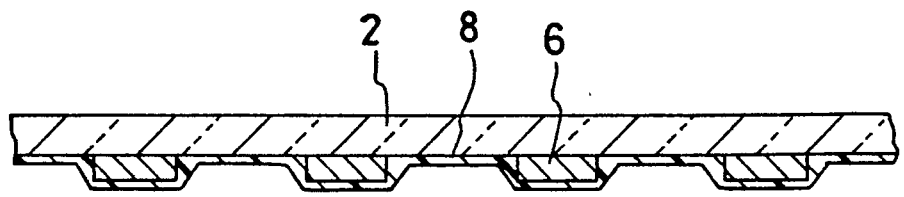
FIGS. 3A–3D are sectional views showing steps of a method for connecting the circuit boards according to the present invention.
Figure 3:
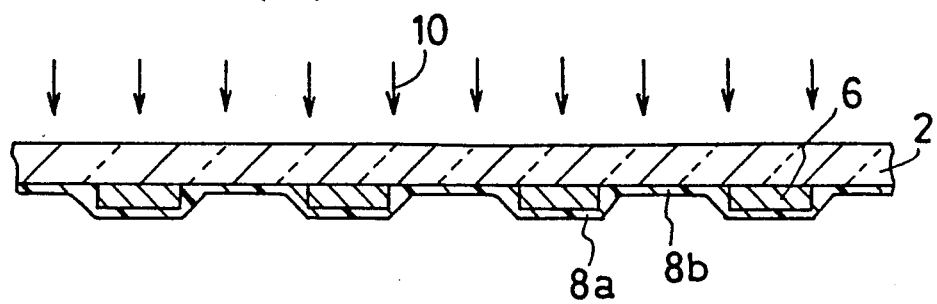
Figure 3:
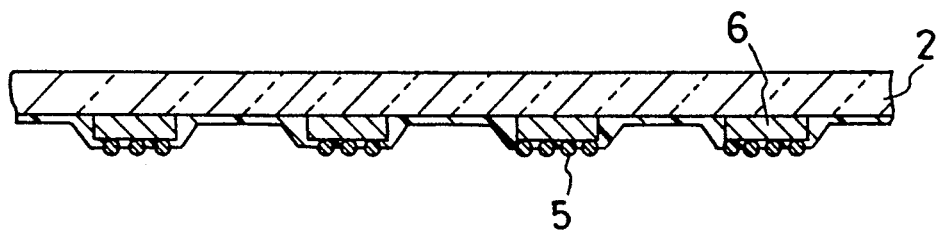
Figure 3:
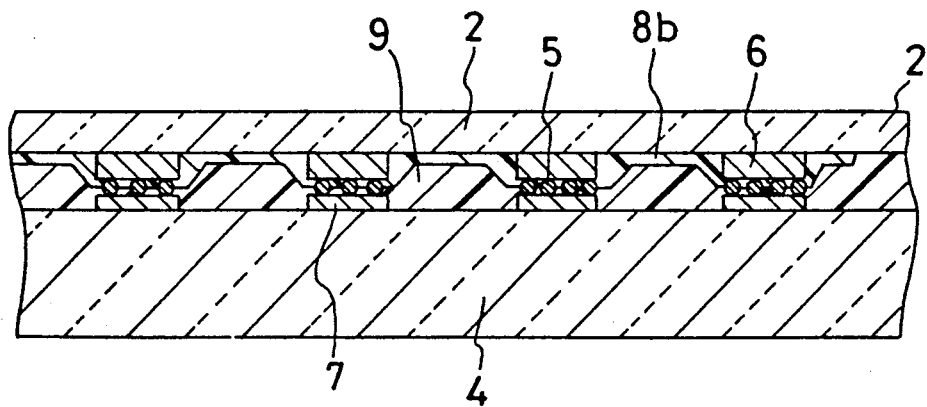

FIG. 3 is a section view for sequentially explaining a method for connecting the circuit boards according to the present invention.

As shown in FIG. 3 (A), the first shaded electrodes 6 are formed on the first light-transmissive circuit board 2. A photocuring adhesive 8 is applied on the first electrodes 6 and the residual regions of the first circuit board on which the first electrodes 6 are not formed (a first step).

The first light-transmissive circuit board 2 may be a light-transmissive flexible board composed of polyimide resin, polyester resin or the like.

The photocuring adhesive 8 is formed of oligomers and/or monomers which keep adhesive when the light has not been irradiated yet and which are photopolymerized and cured to become non-adhesive in the presence of a photopolymerization initiator when the light is irradiated. A typical example of the oligomer is an acrylate oligomer such as polyester acrylate, epoxy acrylate, urethane acrylate or the like. A typical example of the monomer is a monofunctional acrylate derivative, a multifunctional acrylate derivative or N-vinyl pyrrolidone. The specific examples of the oligomers and monomers are shown in Tables 1 and 2. Typical examples of a photopolymerization initiator are shown in Table 3. In addition to the oligomers and/or monomers as principal components and the photopolymerization initiator, various solvents or coupling agents are added to the photocuring adhesive.

TABLE 1

| Classification | Feature of oligomers Constitution |
|---|---|
| Polyester acrylate | $A-O-R_1-OC(=O)-R_2-C(=O)-O-R_1-O-A$ |
| Epoxy acrylate | (1) Bisphenol type $A-O-CH_2CH(OH)CH_2-O-\phi-Y-\phi-O-CH_2CH(OH)CH_2-O-A$ $Y = \begin{cases} -C(CH_3)_2- & \text{Bisphenol A type} \\ -SO_2- & \text{Bisphenol S type} \\ -CH_2- & \text{Bisphenol F type} \end{cases}$ (2) Novolac type |
| Urethane acrylate | $\underset{\text{Hard segment}}{A-I}-\underset{\text{Soft segment}}{[P]_n}-\underset{\text{Hard segment}}{I-A}$ I = —OCN: isocyanate group P: polyester or polyether |

Note) A denotes an acryloyl group, i.e., $CH_2=CHCO-$.

TABLE 2

| Functional number | Name | Code | Constitution | Molecular weight | Specific gravity (25° C.) | Viscosity [cps] (25° C.) | Tg of homopolymer [°C.] | Coefficient of shrinkage [%] | PII |
|---|---|---|---|---|---|---|---|---|---|
| Mono | 2-etylhexyl acrylate | EHA | A—O—CH$_2$CHC$_4$H$_9$ <br> \| <br> C$_2$H$_5$ | 184 | 0.89 | 1.5 | −55 | — | 8 |
| | 2-hydroxyetyl acrylate | HEA | A—O—CH$_2$CH$_2$OH | 116 | 1.11 | 5.3 (28° C.) | −15 | — | 8 |
| | tetrahydro flufulyl acrylate | THFA | A—O—CH$_2$ (tetrahydrofuran ring) | 156 | 1.07 | 2.8 | 60 | — | 8 |
| | EO-denaturation methacrylate phosphate | — | CH$_2$=CHOOCH$_2$CH$_2$O—P(=O)(—OH)(—OH) <br> \| <br> CH$_3$ | | | | | — | 1.4 |
| | glycydile methacrylate | GMA | CH$_2$=CCOOCH$_2$CH—CH$_2$ (epoxide) <br> \| <br> CH$_3$ | | | 2.0 | 41 | — | — |
| | N-vinyl pyrrolidone | — | (pyrrolidone with N—CH=CH$_2$) | | | 20 | 175 | 12.5 | 0.4 |
| Bi | 1,6-hexan diol diacrylate | HDDA | A—O(—CH$_2$)$_6$O—A | 226 | 1.02 | 6 | — | 18 | 6.0 |
| | polyethylene glycol 400 diacrylate | PEG 400 DA | A—O(—C$_2$H$_4$O)$_8$C$_2$H$_4$—O—A | 522 | 1.12 | 50 | — | — | 0.9 |
| | hydroxy pivalate ester neopentyl glycol diacrylate | HPNDA or MANDA | A—O—CH$_2$—C(CH$_3$)(CH$_3$)—CH$_2$OCO—C(CH$_3$)(CH$_3$)—CH$_2$—O—A | 312 | 1.04 | 20 | — | — | 1.25 |

TABLE 2-continued

| Functional number | Name | Code | Constitution | Molecular weight | Specific gravity (25° C.) | Viscosity [cps] (25° C.) | Tg of homopolymer [°C.] | Coefficient of shrinkage [%] | PII |
|---|---|---|---|---|---|---|---|---|---|
| | tripropylene glycol diacrylate | TPGDA | A—O(―C$_3$H$_6$O―)$_2$C$_3$H$_6$—O—A | — | — | 20 | — | — | 2.2 |
| | EO denaturation bisphenol A diacrylate | — | A(―O—C$_2$H$_4$―)$_2$—O—⟨phenyl⟩—C—⟨phenyl⟩—O(―C$_2$H$_4$—O―)$_2$A | — | — | 880 | — | — | — |
| Tri or more | trimethylol propane triacrylate | TMPTA | C$_2$H$_5$—C(CH$_2$—O—A)$_3$ | 295 | 1.11 | 70 to 100 | — | — | 4.8 |
| | pentaerythritol triacrylate | PETA | HO—CH$_2$—C(CH$_2$—O—A)$_3$ | 298 | 1.18 | 700 | — | — | 2.8 |
| | dipentaerythritol hexaacrylate | DPHA | A—O—CH$_2$—C(CH$_2$—O—A)$_2$—CH$_2$OCH$_2$—C(CH$_2$—O—A)$_2$—CH$_2$—O—A | 578 | 1.17 | 4500 | — | — | 0.54 |

Note) A denotes an acryloyl group, i.e., CH$_2$=CHCO—.

TABLE 3

| Name | Constitutional formula | Type of radical generation | Absorption peak wavelength (mm) | Feature |
|---|---|---|---|---|
| benzyl dimethyl ketal | (structure: phenyl-C(=O)-C(OCH₃)(OCH₃)-phenyl) | P1 | 340 | Colorless and transparent crystal powder<br>Various uses |
| 1-hydroxy cyclohexyl-phenyl ketone | (structure: phenyl-C(=O)-C₆H₁₀(OH)) | P1 | 330 | Colorless and transparent crystal powder<br>Low yellowing |
| 1-phenyl-2-hydroxy-2-methylpropane-1-on | (structure: phenyl-C(=O)-C(CH₃)(CH₃)-OH) | P1 | 240<br>310 | Transparent liquid<br>No yellowing<br>Viscosity: 25 cps |
| benzophenone | (structure: phenyl-C(=O)-phenyl) | P2 | 340 | White powder<br>Special odor<br>Good transparency |
| Michler's ketone (4,4'-dimethyl amino benzophenone) | (structure: (CH₃)₂N-phenyl-C(=O)-phenyl-N(CH₃)₂) | P2 | 365 | Yellowish green powder<br>Take notice of toxicity<br>Combine it with benzophenone |

The photocuring adhesive 8 may be applied by spin coating, roll coating, dipping, printing or the like.

It is appropriate that the photocuring adhesive 8 is applied with a thickness of about one tenth to one half of a diameter of the conductive particle 5 to be described below.

As shown in FIG. 3 (B), light 10 is irradiated from a surface opposite to the surface of the first circuit board 2 on which the first electrodes 6 are formed. Consequently, the photocuring adhesive 8b becomes cured and non-adhesive between the first electrodes 6. On the other hand, since the light is shaded by the first electrodes 6, the photocuring adhesvie 8a on the first electrodes 6 keeps uncured and adhesive (a second step).

As shown in FIG. 3 (C), when the conductive particles 5 are dispersed, they are selectively adhered to the first electrodes 6 which are adhesive (a third step). The unnecessary conductive particles 5 which are adhered to other regions by electrostatic force or the like are removed by air blow, a brush or the like.

The conductive particle 5 is conductive at least on an outer peripheral surface thereof and may be formed of a metal such as Ni, Co, Au, Cu, Ag, In, Pd, Sn, Pb or the like, or their alloy. By way of example, the conductive particle 5 may be an Ag particle which has a maximum diameter of 60 μm. In addition, one of the above metals or more may be coated on a surface of a resin ball formed of a polymeric material (for example, Ni-plated resin beads having a diameter of about 5 to 30 μm may be used), or one of the above metals or more may be mixed with the resin ball formed of the polymeric material. In this case, the polymeric material may be synthetic resin such as polyimide resin, epoxy resin, acrylic resin or the like and synthetic rubber such as urethane rubber, silicone rubber or the like. Furthermore, a method for coating a metal may be sputtering, electrobeam, electroless plating or the like.

In the case in which a non-flexible board such as a glass board is connected, the conductive particle 5 formed by coating the metal on the resin ball or by mixing the metal with the resin ball can absorb the dispersion of heights of the electrodes.

As shown in FIG. 3 (D), the first electrodes 6 of the first circuit board 2 to which the conductive particles 5 are adhered are caused to oppose to the second circuit board 4 on which the second electrodes 7 are formed so that the first electrodes 6 and the second electrodes 7 are aligned and caused to come into contact with each other (a fourth step). The first electrodes 6 and the second electrodes 7 may be caused to come into contact with each other by injecting an adhesive 9 between the boards or by applying external force with use of a clip or the like.

Before the first circuit board 2 is caused to come into contact with the second circuit board 4, the light may be irradiated on the surface of the first circuit board 2 on which the first electrodes 6 are formed so that the photocuring adhesive 8a on the first electrodes 6 is cured to fix the conductive particles 5 (a fifth step).

While the present embodiment has described the case in which the flexible board 2 is connected with the glass board 4 of the liquid crystal display element, the present invention can also be applied to the case in which the flexible board 2 is connected with the circuit board 3 in FIG. 2.

Furthermore, while the present embodiment has described the case in which the conductive particles 5 are arranged on the light-transmissive flexible board 2 with reference to FIG. 3, the conductive particles 5 can also be arranged on other light-transmissive boards. By way of example, in the case in which the electrodes 7 on the glass board 4 of the liquid crystal display element are formed of a shaded material such as Ni, Mo, Ti, Ta or the like, the conductive particles 5 can also be arranged on the glass board 4 to be connected with the flexible board 2 in accordance with the present invention.

According to the present invention, the conductive particles can selectively be arranged on the first electrodes of the first circuit board very easily to electrically connect the first circuit board with the second circuit board by means of the conductive particles. Accordingly, in the case in which the electrodes having fine pitches are connected with each other, a short-circuit or leak can also be prevented so that the reliability of connection will be improved remarkably.

Furthermore, since the photocuring adhesive is selectively cured by means of the first shaded electrodes, an expensive photomask is not required. Consequently, the cost can be reduced. In addition, since the alignment is not required, the process can be simplified.

What is claimed is:

1. In a method for connecting circuit boards in which a first circuit board having a first surface comprising first electrodes and first residual regions on which said first electrodes are not formed is superposed on a second circuit board having a second surface comprising second electrodes and second residual regions on which said second electrodes are not formed wherein said second electrodes are formed in positions corresponding to the first electrodes so that the first and second electrodes are electrically connected with each other, the method comprising:

a first step of applying a photocuring adhesive on the first electrodes and the first residual regions;

a second step of irradiating light through the first circuit board from a surface opposite the first surface so as to cure the photocuring adhesive on the first residual regions of the first circuit board while leaving uncured the photocuring adhesive on the first electrodes;

a third step of adhering particles which are conductive at least on their outer peripheral surfaces to the first electrodes by means of the uncured photocuring adhesive; and a fourth step of superposing the first circuit board to which the particles are adhered on the second circuit board to electrically connect the first and second electrodes with each other through the particles, provided that the first electrodes are opaque and the first circuit board is light-transmissive.

2. A method according to claim 1, wherein the adhesive is injected between the first and second residual regions so that the first circuit board is superposed on the second circuit board in said fourth step.

3. A method according to claim 1, wherein the first circuit board is superposed on the second circuit board by external force in said fourth step.

4. A method according to claim 1, further comprising a fifth step of irradiating light onto the first surface of the first circuit board to cure the uncured photocuring adhesive on the first electrodes between the third and fourth steps.

5. A method according to claim 1, wherein the photocuring adhesive is formed of oligomers and/or monomers which keep adhesive before irradiation and which when irradiated are photopolymerized and cured to become non-adhesive in the presence of a photopolymerization initiator.

6. A method according to claim 5, wherein the oligomer is an acrylate oligomer.

7. A method according to claim 5, wherein the monomer is a monofunctional acrylate derivative, a multifunctional acrylate derivative or N-vinyl pyrrolidone.

8. A method according to claim 1, wherein the photocuring adhesive is applied with a thickness of one tenth to one half of a diameter of the conductive particle.

9. A method according to claim 3, wherein the external force is a clip.

10. A method according to claim 6, wherein the acrylate oligomer is selected from the class consisting of polyester acrylate, epoxy acrylate and urethane acrylate.

* * * * *